(12) United States Patent
Goon et al.

(10) Patent No.: US 7,279,722 B2
(45) Date of Patent: Oct. 9, 2007

(54) LIGHT EMITTING DEVICE WITH ADJUSTABLE REFLECTOR CUP

(75) Inventors: Wool Kin Goon, Penang (MY); Thye Linn Mok, Penang (MY); Kee Yean Ng, Penang (MY); Janet Bee Yin Chua, Perak (MY); Gim Eng Chew, Penang (MY); Rene P. Helbing, Palo Alto, CA (US)

(73) Assignee: Avago Technologies ECBU IP (Singapore) Pte Ltd, Singapore (SG)

( * ) Notice: Subject to any disclaimer, the term of this patent is extended or adjusted under 35 U.S.C. 154(b) by 132 days.

(21) Appl. No.: 11/255,544

(22) Filed: Oct. 21, 2005

(65) Prior Publication Data

US 2007/0090379 A1    Apr. 26, 2007

(51) Int. Cl.
*H01L 29/22* (2006.01)
(52) U.S. Cl. .................. 257/98; 257/99; 257/E33.058; 257/E33.068; 257/E33.073
(58) Field of Classification Search .................. 257/79, 257/84, 98, 99, 100, E33.058, E33.068, E33.072, 257/E33.073
See application file for complete search history.

(56) References Cited

U.S. PATENT DOCUMENTS

| | | | |
|---|---|---|---|
| 6,666,565 B2 * | 12/2003 | Gabe | 362/184 |
| 6,939,188 B2 * | 9/2005 | Katayama et al. | 445/13 |
| 7,178,937 B2 * | 2/2007 | McDermott | 362/187 |
| 7,193,243 B2 * | 3/2007 | Park | 257/80 |
| 2002/0172046 A1 | 11/2002 | Perlo et al. | |
| 2003/0117797 A1 * | 6/2003 | Sommers et al. | 362/237 |
| 2005/0007683 A1 | 1/2005 | Ryu et al. | |
| 2005/0134955 A1 | 6/2005 | Greywall et al. | |
| 2005/0213334 A1 * | 9/2005 | Lee et al. | 362/310 |

OTHER PUBLICATIONS

Luo, Hong et al., "Analysis of high-power packages for phosphor-based white-light-emitting diodes," Applied Physics Letters 86, 243505 (2005).
Tuantranont, Adisorn et al., "Segmented Silicon-Micromachined Microelectromechanical Deformable Mirrors for Adaptive Optics," IEEE Journal of Selected Topics in Quantum Electronics, vol. 8, No. 1, Jan./Feb. 2002.

* cited by examiner

*Primary Examiner*—Trung Dang

(57) ABSTRACT

A light emitting device has a light emitting diode (LED), a reflector cup, and one or more adjustment mechanisms to control the intensity profile of light emitted from the light emitting device. The reflector cup has a base and a sidewall extending outward from the base. A base adjustment mechanism controls the total amount of light reflected from the base and into the beam of light emitted from the light emitting mechanism by controlling the aggregate reflectivity of the base. A sidewall adjustment mechanism controls the angle of the sidewall relative to the base. A vertical adjustment mechanism vertically raises or lowers the LED relative to the base.

20 Claims, 8 Drawing Sheets

LIGHT EMITTING DEVICE WITH ADJUSTABLE REFLECTOR CUP

BACKGROUND OF THE INVENTION

LEDs (light emitting diodes) are currently used in a variety of applications, replacing the incandescent bulb and conventional fluorescent light sources in applications such as flash cameras, full color sign display, traffic lights, bicycle lights, and an increasing number of other innovative uses. LEDs have the advantage of emitting light defined by select wavelengths, or defining a limited spectrum, thereby reducing energy expenditure found in incandescent bulbs that typically propagate unwanted wavelengths. FIG. 1A depicts a side elevational view of a conventional light emitting device 100 having a reflector cup 107 with a fixed sidewall 105, a fixed base 103, and an LED 101 disposed within the reflector cup at a fixed position. FIG. 1B is a top plan view of the light emitting device of FIG. 1A, showing the LED 101 in the center of the reflector cup, the fixed base 103 of the reflector cup surrounding the LED, and the fixed sidewall surrounding the base. A limitation inherent in the conventional light emitting devices of FIGS. 1A and 1B is that light emitted from the device is distributed over a fixed field of view, resulting in a fixed intensity profile. As a consequence, either a single light emitting device must be used to satisfy a wide variety of applications, or multiple light emitting devices must be used having a field of view and a corresponding intensity profile tailored for a specific application. Additionally, because the total volume of light from a conventional light emitting device is fixed, the volume of light being cast upon an object can often be too much, or too little.

SUMMARY OF THE INVENTION

A light emitting device has a light emitting diode (LED), a reflector cup, and one or more adjustment mechanisms to control the intensity profile of light emitted from the light emitting device. The reflector cup has a base and a sidewall extending outward from the base. A base adjustment mechanism controls the total amount of light reflected from the base by controlling the aggregate reflectivity of the base. In an embodiment, the base adjustment mechanism includes an aperture having a comparatively low reflectivity that is configured to adjustably shield a varying amount of surface area of a reflective base structure having a comparatively high reflectivity. As a greater amount of the surface of the reflective base structure is increasingly exposed to light from the LED, the aggregate reflectivity of the base increases. As the available surface area of the reflective base structure is increasingly shielded from the LED, the aggregate reflectivity of the base decreases.

A sidewall adjustment mechanism controls the angle of the sidewall relative to the base. The sidewall can be formed from an aperture to achieve adjustability. As the angle of the sidewall relative to the base is widened, the field of view of the light emitting device is widened, spreading light over a greater area, but decreasing the concentration of light within the center portion of the field of view. As the angle of the sidewall relative to the base is narrowed, the field of view of the light emitting device is narrowed, focusing the light over a narrower area, but increasing the concentration of light within the center area of the field of view.

A vertical adjustment mechanism vertically raises or lowers the LED relative to the base. The vertical adjustment mechanism can include a motor driven shaft such as a linear actuator. As the LED is raised relative to the base, it approaches the top of the reflector cup, thereby widening the field of view of light emanating from the reflector cup. As the LED is lowered relative to the base, it recedes from the top of the reflector cup, thereby narrowing the field of view of light emanating from the reflector cup.

The adjustable mechanisms described above can be implemented individually or in any combination to control the intensity profile of light emitted from the light emitting device. A controller can govern the operation of the base adjustment mechanism, the sidewall adjustment mechanism, and/or the vertical adjustment mechanism. Embodiments are also envisioned wherein the various adjustment mechanisms are controlled directly by a human agent.

Other aspects and advantages of the present invention will become apparent from the following detailed description, taken in conjunction with the accompanying drawings, illustrated by way of example of the principles of the invention.

BRIEF DESCRIPTION OF THE DRAWINGS

FIG. 4B is a top plan view of the LED reflector cup of FIG. 4A.

FIG. 4C is a side elevational view of the LED reflector cup of FIG. 4A.

FIG. 6A wherein the vertical adjustment mechanism comprises a motor and a shaft.

Throughout the description similar reference numbers may be used to identify similar elements.

DETAILED DESCRIPTION

Figure 2A:
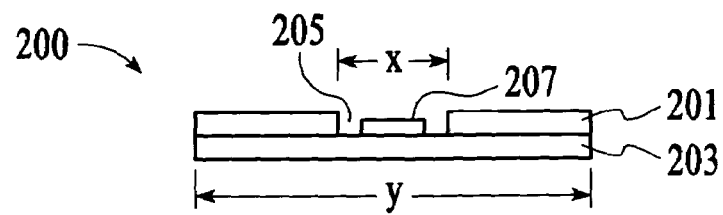
FIG. 2A is a cross-cut side elevational view of an adjustable base of a light emitting device with an adjustable base aperture in a comparatively constricted state.
Figure 2B:
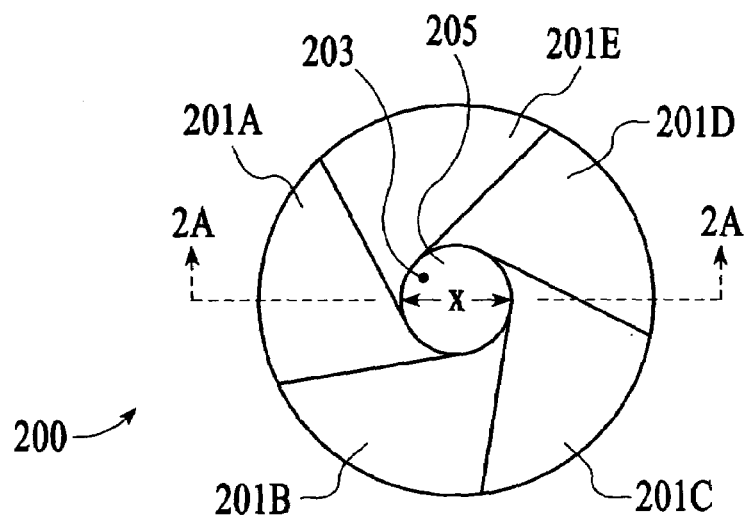
FIG. 2B is a top plan elevational view of the adjustable base of FIG. 2A, with the adjustable base aperture in a comparatively constricted state.
Figure 3A:
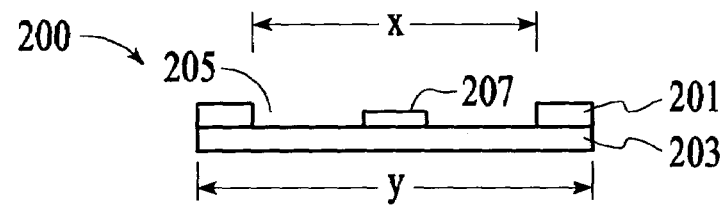
FIG. 3A is a side elevational view of the adjustable base of FIG. 2A with the adjustable base aperture in a comparatively dilated state.
Figure 3B:
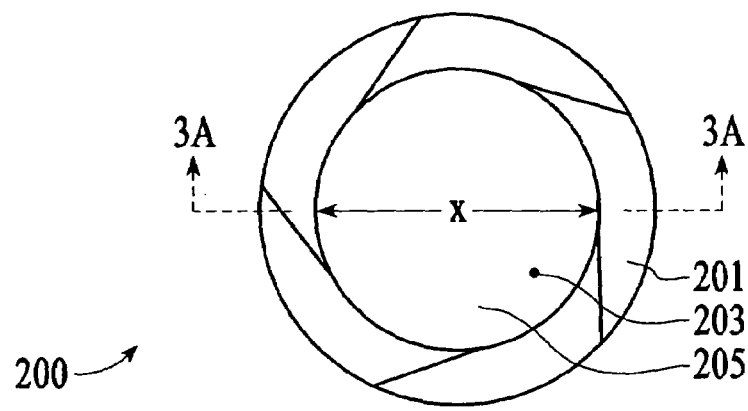
FIG. 3B is a top plan view of the adjustable base of FIG. 3A with the adjustable base aperture in a comparatively dilated state.

A light emitting device has a light emitting diode (LED), a reflector cup, and one or more adjustment mechanisms to control the intensity profile of light emitted from the light emitting device. The reflector cup has a base and a sidewall extending outward from the base. A base adjustment mechanism controls the total amount of light reflected from the base by controlling the aggregate reflectivity of the base. FIG. 2A depicts a side elevational cross-cut view of an adjustable base 200 of a reflector cup (sidewall not shown), and an LED 207 disposed proximate the base. The adjustable base 200 includes a reflective base structure 203 and a base adjustment mechanism. According to the embodiment of FIG. 2A, the base adjustment mechanism includes an adjustable base aperture 201 disposed above the reflective base structure. FIG. 2B is a top plan view of the adjustable base 200 of FIG. 2A. The adjustable base aperture 201 includes multiple aperture plates 201A-201E. The exact number of aperture plates forming the aperture depicted in FIGS. 2B and 3B is exemplary. According to an embodiment, the base adjustment mechanism includes a mechanical linkage coupled to at least one aperture plate and configured to exert a force on the aperture plate. The aperture plates are mechanically interconnected such that the force exerted by the mechanical linkage on one or more aperture plates will be mechanically transmitted to the remaining aperture plates. The reference to aperture plates is a functional description, and includes an adjustable base aperture comprising single piece construction but having a plurality of sections functioning as independent aperture plates. According to an embodiment, the reflectivity of the upper surface of the adjustable base aperture is less than the reflectivity of the reflective base structure. The LED (not shown in FIG. 2B or 3B to reduce confusion and clutter in these drawings) is disposed within an open center region 205 of the adjustable base aperture. The open center region 205 within the adjustable base aperture has a variable diameter "x" according to the constriction or dilation of the adjustable base aperture. The portion of the reflective base structure surrounding the LED that rests inside of the open center region is therefore not covered by the adjustable base aperture and functions to reflect light from the LED back into the field of view of the light emitting device. As the adjustable base aperture is adjusted by the base adjustment mechanism 803 (shown in FIG. 10), the area of the open center region is increased or decreased. As a consequence, the area of the reflective base structure exposed to light from the LED varies, thereby varying the aggregate reflectivity of the base. FIGS. 3A and 3B show the same adjustable base of FIGS. 2A and 2B, but the adjustable base aperture is in a comparatively constricted state in FIGS. 2A and 2B, and in a comparatively dilated state in FIGS. 3A and 3B.

In operation, a controller (shown in FIG. 10) controls the adjustable base aperture 201, thereby altering the percent of the base surface that is defined by the reflective base structure and the percent of the base surface that is defined by the comparatively less reflective adjustable base aperture. When the adjustable base aperture progressively constricts, a higher percentage of the base surface is progressively defined by the comparatively poorly reflecting adjustable base aperture and a lower percentage of the base surface is progressively defined by the reflective base structure. As a result, constriction of the aperture progressively reduces the aggregate reflectivity of the base, thereby reducing the amount of light reflected by the base into the field of view when the LED is energized. Conversely, dilation of the adjustable base aperture progressively increases the aggregate reflectivity of the base, thereby increasing the amount of light reflected by the base into the field of view when the LED is energized. Through controlling the reflectivity of the base, therefore, the amount of light reflected by the base back into the field of view can be controlled. In an embodiment, the base adjustment mechanism includes micromotors, such as those used in micro-electromechanical machines (MEMS). For example, micromotors are used to control each of the individual plates of the adjustable base aperture. In the above disclosure, many specific elements are exemplary, and are not intended to limit the scope of the invention. For example, although the embodiment described above depicts an adjustable base aperture having a comparatively lower reflectivity and a bottom structure (the reflective base structure 203) having a comparatively higher reflectively, embodiments are envisioned wherein the bottom base structure is comparatively less reflective than the adjustable base aperture. The functionality of the adjustable base would remain the same but the specific operation of it would be reversed. Accordingly, the recitation of specific details herein is not intended to limit the appended claims from equivalent structures.

Alternative embodiments for controlling the aggregate reflectivity of the base include, but are not limited to, the use of MEMS such as a MEMS diffraction grating apparatus comprising multiple movable ribbons that can be adjusted to affect the percent of light that is reflected by the base back into the field of view and the percent of light that is diffracted. Adjustable MEMS mirrors can also be used to increase or decrease the aggregate reflectivity of the base. Molecular alignments and arrangements may also be altered to increase or decrease the reflectivity of a surface. The appended claims comprehend these alternative approaches for adjusting the reflectivity of the base of a reflector cup, and are not limited to any one embodiment.

Figure 1A:
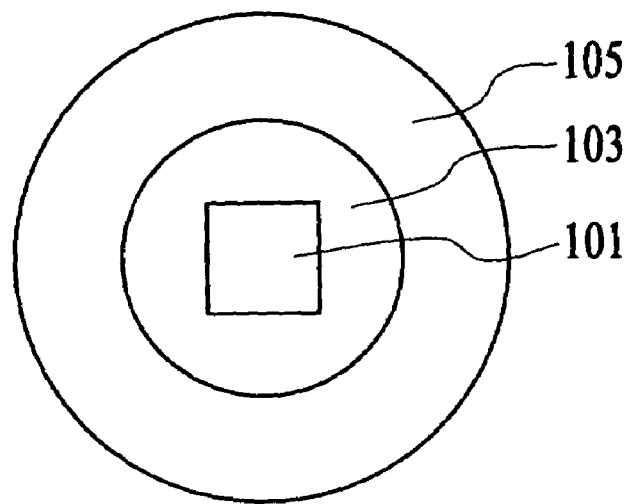
FIG. 1A is a side elevational view depicting a prior art light emitting device having a fixed reflector cup, including a fixed base, fixed sidewall, and an LED in a fixed position.
Figure 1B:
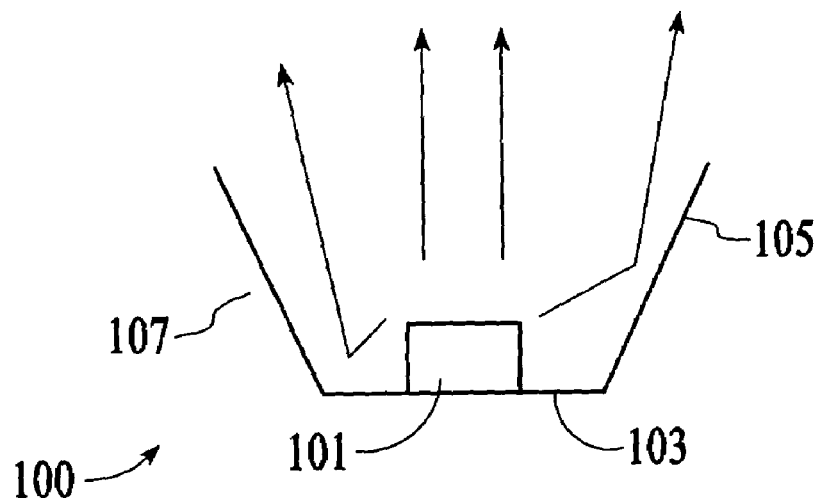
FIG. 1B is a top plan view of the prior art light emitting device of FIG. 1.
Figure 4A:
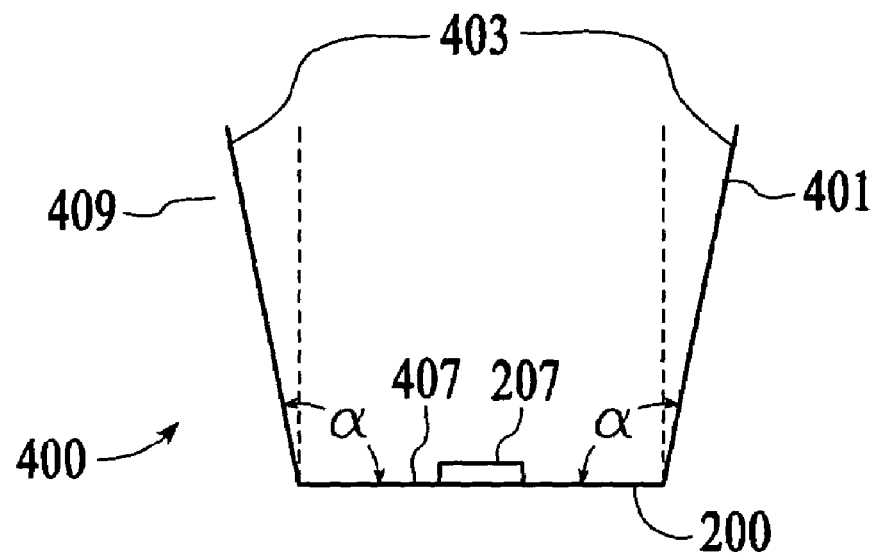
FIG. 4A is a side elevational cross-cut section of an LED reflector cup with an adjustable sidewall having approximately a 100 degree angle relative to the base.

FIG. 4A is a side elevational cross-cut section of a light emitting device 400 having an LED 207 disposed within a reflector cup 409. The reflector cup has a base 200 and an adjustable sidewall 401. The adjustable wall angle, α, defines the angle of the sidewall relative to the base. The adjustable sidewall is controlled by a sidewall adjustment mechanism 805 (shown in FIG. 10). The sidewall 401 has an interior surface 403 that functions to reflect light emitted from the LED 207. The base used in conjunction with an adjustable sidewall 401 can be an adjustable base 200 as shown in FIG. 2A, or a fixed base 103 as described in the prior art of FIG. 1A. FIG. 4B is a top plan view of the adjustable sidewall of FIG. 4A, disclosing the adjustable sidewall 401 as having an aperture-type structure formed by a plurality of aperture plates 405A-405F encircling the base 200 and the LED. The exact number of aperture plates forming the aperture depicted in FIGS. 4B and 5B is exemplary. FIG. 4C depicts a side elevational view of the adjustable sidewall 401 of FIG. 4A. According to an embodiment, the sidewall adjustment mechanism includes a mechanical linkage coupled to at least one aperture plate and configured to exert a force on the aperture plate. The aperture plates are mechanically interconnected such that the force exerted by the mechanical linkage on one or more aperture plates will be mechanically transmitted to the remaining aperture plates.

Figure 5A:
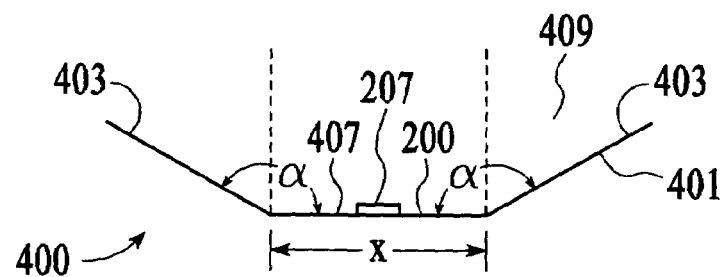
FIG. 5A is a side elevational cross-cut section of the LED reflector cup of FIG. 4A, wherein the adjustable sidewall has an angle of approximately 135 degrees relative to the base.
Figure 5B:
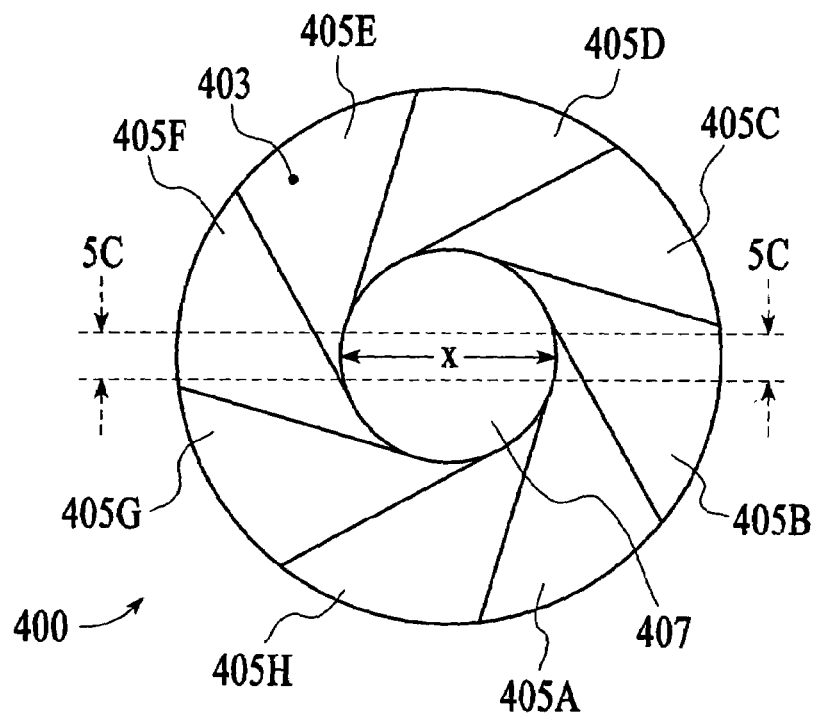
FIG. 5B is a top plan view of the LED reflector cup of FIG. 5A.
Figure 5C:
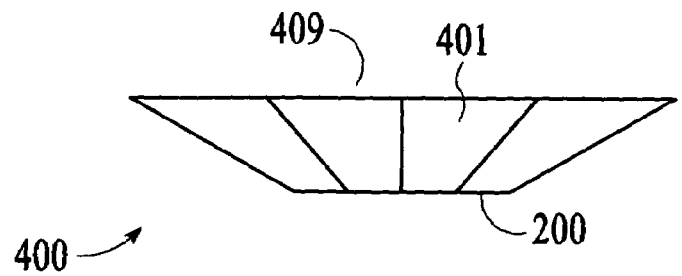
FIG. 5C is a side elevational view of the LED reflector cup of FIG. 5A.

FIGS. 5A, 5B, and 5C depict the same elements as FIGS. 4A, 4B, and 4C respectively. In FIGS. 5A, 5B, and 5C, the angle of the sidewall relative to the base is about 130-140 degrees. In contrast, FIGS. 4A, 4B, and 4C, depict the angle of the sidewall relative to the base of about 100 degrees. As discussed below in conjunction with FIG. 9, adjusting the angle of the sidewall relative to the base will alter the intensity profile of the light emanating from the light emitting device. When the angle of the sidewall relative to the base is decreased, the field of view is reduced to focus within a narrower region, thereby increasing the concentration of light within the center area of the field of view. As the angle of the sidewall relative to the base is increased, the field of view is enlarged, thereby increasing the size of the region over which light is spread but decreasing the concentration of light within the center area of the field of view. Within FIGS. 4C and 5C, the substantially straight depiction of the sidewall is exemplary. Embodiments are envisioned which include alternative sidewall configurations, shapes, etc., including, but not limited to curved sides that approximate a parabolic shape, as well as other shapes and geometric arrangements selected to focus light in a predetermined manner. In an embodiment, the sidewall adjustment mechanism includes micromotors, such as those used in MEMS. For example, micromotors are used to control each of the individual plates of the adjustable sidewall.

Figure 10:
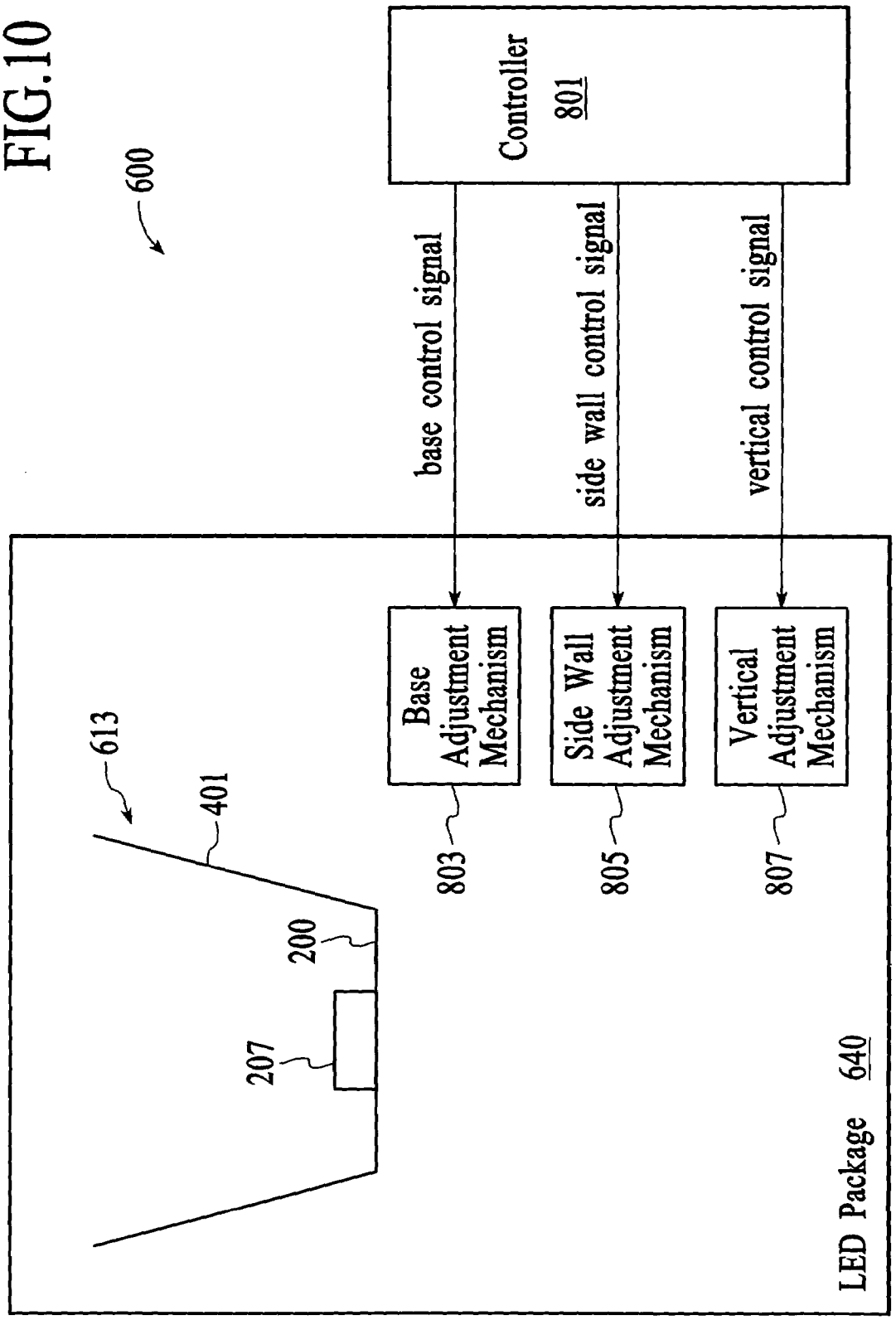
FIG. 10 is a depiction of a system for controlling the three adjustable mechanisms of the light emitting device of FIG. 8.

In operation, the angle of the sidewall relative to the base is increased or decreased by a controller (shown in FIG. 10). The controller can operate according to the input commands of a user or according to a programmed, mechanized or automated system. If an intensity profile having a narrow field of view and a corresponding high concentration of light in the center area of the field of view is desired, a comparatively smaller angle of the sidewall relative to the base is selected and the sidewall is adjusted as necessary. If an intensity profile having a wider field of view and a corresponding lower concentration of light in the center area of the field of view is desired, a comparatively larger angle of the sidewall relative to the base is selected, and the sidewall is adjusted as necessary. By adjusting the angle of the sidewall relative to the base in this manner, the field of view of the light emitting device and the intensity profile of light emanating from the light emitting device can be controlled.

Figure 6A:
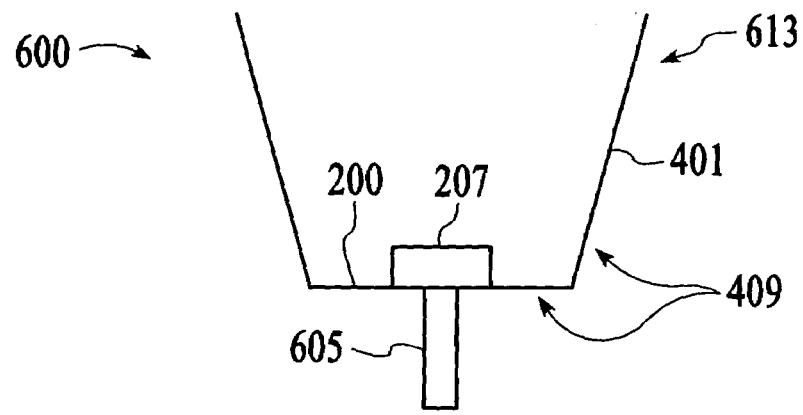
FIG. 6A is a side elevational view of a light emitting device having an LED that is vertically adjustable relative to the base of the reflector cup, with the LED positioned proximate the base.
Figure 6B:
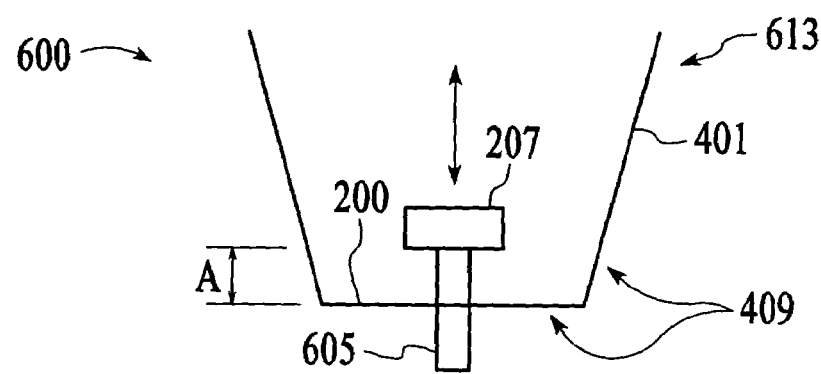
FIG. 6B is a side elevational view of the light emitting device of FIG. 6A with the LED positioned above the base.

FIGS. 6A and 6B depict a side elevational view of a vertically adjustable LED embodiment of a light emitting device 600. The light emitting device has a vertically adjustable LED 207 disposed within a reflector cup 409. The reflector cup includes a sidewall 401 and a base 200. The sidewall used in conjunction with the vertically adjustable LED embodiment can be an adjustable sidewall as discussed in conjunction with FIGS. 4 and 5 or a fixed sidewall 105 as found in prior art embodiments. Similarly, the base used in conjunction with the vertically adjustable LED embodiment can be an adjustable base embodiment as discussed in conjunction with FIGS. 2 and 3 or a fixed base embodiment 103 as found in prior art embodiments. The specific details of the sidewall 401 and the base 200 within FIGS. 6A and 6B are therefore exemplary and not intended to limit the scope of the appended claims. A vertical adjustment mechanism is configured to adjust the vertical position of the LED relative to the base 200 of the reflector cup 409. According to an embodiment, the LED rests on a shaft 605 aligned with a hole (not shown) in the base. The shaft can be raised or lowered by an appropriate mechanism. FIG. 6A illustrates a shaft in a relatively lowered position, thereby positioning the LED proximate the base and decreasing the field of view, but increasing the concentration of light in the center area of the field of view. FIG. 6B depicts an LED on a shaft that has been raised relative to the base, thereby elevating the LED relative to the base and increasing the field of view, but decreasing the concentration of light in the center area of the field of view.

In operation, the vertical position of the LED relative to the base is raised or lowered by a vertical adjustment mechanism 807 (shown in FIG. 10). The controller can operate according to the input commands of a user or according to a programmed, mechanized or automated system. If a user desires an intensity profile having a narrow field of view or a higher concentration of light in the center area of the field of view, the LED is lowered relative to the base. If a user desires an intensity profile having a wide field of view or a lower concentration of light in the center of the field of view, the LED is raised relative to the base.

Figure 7:
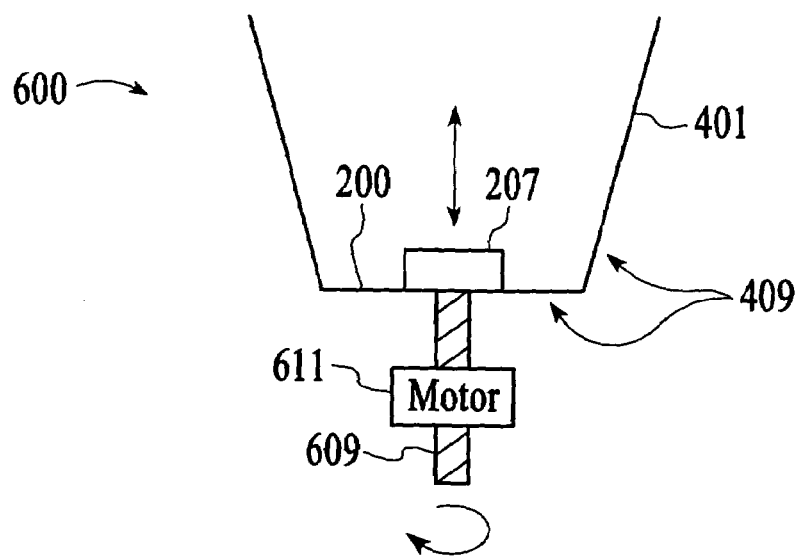
FIG. 7 is a side elevational view of the light emitting device of FIG.

FIG. 7 discloses a side elevational view of an embodiment of the light emitting device of FIGS. 6A and 6B. The shaft 605 of FIGS. 6A and 6B is shown as a threaded shaft 609 that is engaged by a motor 611 for raising and lowering the LED 207 relative to the base 200 of the reflector cup 409. By rotating the motor in a first direction, the height of the LED is raised relative to the base and by rotating the motor in a second direction, the height of the LED is lowered relative to the base. The description of a threaded shaft and motor, however, is exemplary of one embodiment of the invention. The appended claims comprehend a wide variety of mechanisms for raising and lowering an LED, including, but not limited to linear actuators, worm gear mechanisms, electromechanical solenoid-type devices, and pneumatic and hydraulic devices.

Figure 8:
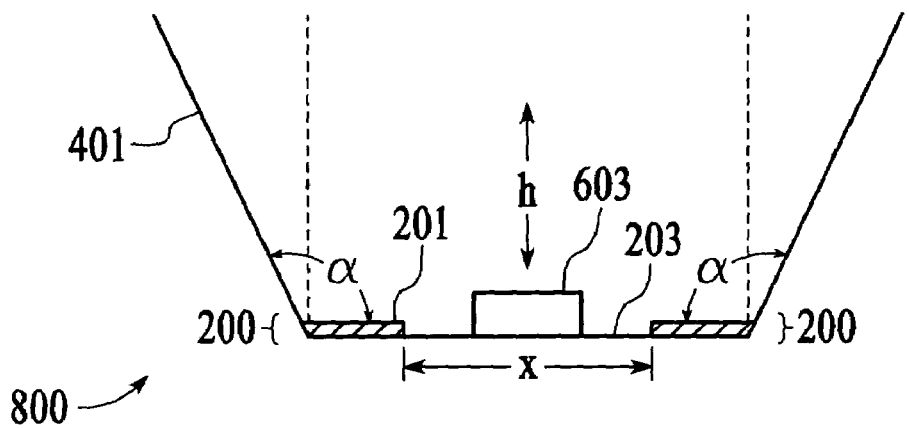
FIG. 8 is a cross sectional view of an adjustable reflector cup showing an adjustable base, an adjustable sidewall, and a vertical adjustment mechanism for adjusting the vertical position of the LED relative to the base.

FIG. 8 is a cross sectional view of a light emitting device 800 having an adjustable base 200, an adjustable sidewall 401, and a vertically adjustable LED 207 in a single embodiment. The adjustable base 200 includes an adjustable base aperture 201 and a reflective base structure 203 as described in conjunction with FIGS. 2A, 2B and 3A, 3B. Parameter "x" represents the adjustable diameter of the open center region 205 of the adjustable base aperture 201, through which a portion of the reflective base structure 203 is exposed. As "x" increases, the aggregate reflectivity of the base increases. The adjustable sidewall 401 is shown as having an adjustable parameter "α" defining the angle of the sidewall relative to the base. As "α" increases, the field of view widens, and the concentration of light within the center of the field of view decreases. The adjustable parameter "h" represents the vertical height of the LED 207 relative to the base. As "h" increases, the field of view widens, and the concentration of light within the center of the field of view is decreased. The depiction shown in FIG. 8, wherein all three variable features are present in a single embodiment, is exemplary. The present invention envisions alternative embodiments incorporating individual adjustable elements and embodiments incorporating any two of the three adjustable elements discussed herein.

Figure 9:
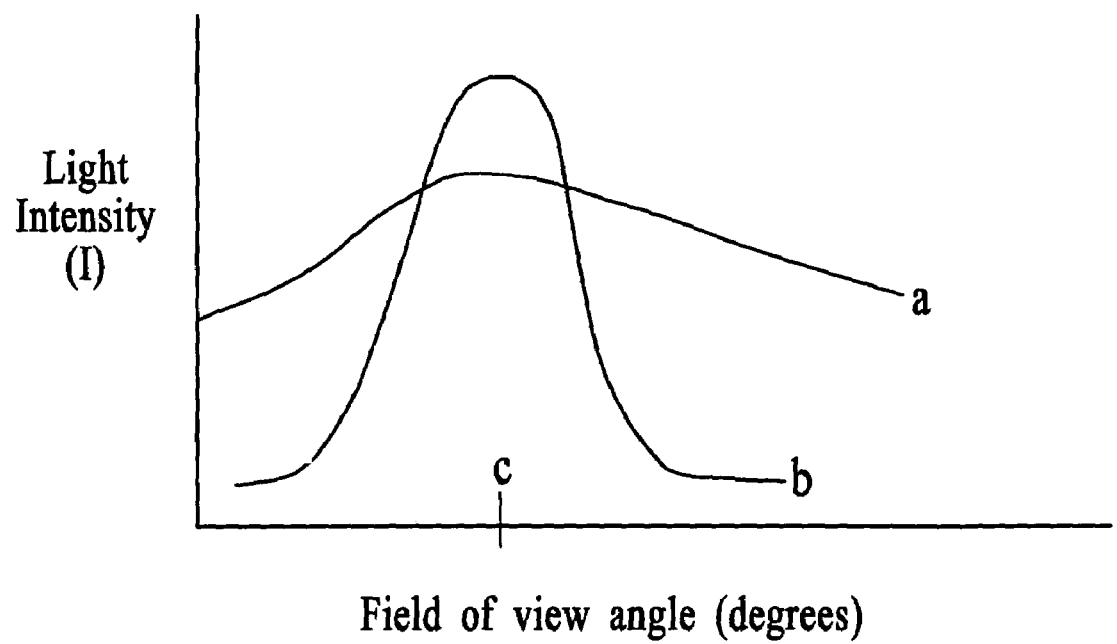
FIG. 9 is a graph illustrating alternative intensity profiles generated by alternative parameter settings of an adjustable light emitting device.

As discussed above, by adjusting the various adjustable parameters, the intensity profile of light emitted from the adjustable light emitting device can be altered. When a fixed amount of light is emitted, widening the field of view has the concurrent effect of reducing the concentration of light in the center area of the field of view. Conversely, narrowing the field of view will increase the concentration of light in the center of the field of view. FIG. 9 is a graph illustrating alternative intensity profiles of light produced as the adjustable parameters are altered. Intensity profile "a" represents a comparatively disbursed light beam, having a comparatively wider field of view, and a comparatively reduced concentration of light in the center of the field of view. This light intensity profile can be achieved variously by increasing the angle of the sidewall relative to the base, and/or raising the vertical height of the LED relative to the base. Intensity profile "b" represents a comparatively focused light beam having a comparatively narrower field of view and a comparatively greater concentration of light in the center of the field of view. This light intensity profile can be achieved variously by decreasing the angle of the sidewall relative to the base, and/or lowering the vertical height of the LED relative to the base.

FIG. 10 depicts a light emitting device 600 within an LED package 640 that includes LED 207, a reflector cup 613, a base adjustment mechanism 803, a sidewall adjustment mechanism 805, a vertical adjustment mechanism 807, and a controller 801. The reflector cup has an adjustable base 200 operatively coupled to the base adjustment mechanism and an adjustable sidewall 401 operatively coupled to the sidewall adjustment mechanism. The LED 207 is disposed within the reflector cup and is coupled to the vertical adjustment mechanism, which is configured to vertically adjust the LED relative to the base. The controller 801 is in signal communication with the base adjustment mechanism 803 through a base control signal generated to control the aggregate reflectivity of the base, with the sidewall adjustment mechanism through a sidewall control signal generated to control the angle of the sidewall relative to the base, and with the vertical adjustment mechanism through a vertical control signal generated to control the vertical height of the LED relative to the base. The reference to control signals herein is intended in the broadest sense, and includes electrical signals, optical signals, RF signals, and signals imparted by mechanical linkage. The controller can be programmable, or can respond to manual inputs, including but not limited to electrical input, digital input, and mechanical input.

In operation, the controller can control all three adjustment mechanisms simultaneously. The controller can, however, limit its control to one or two adjustment mechanisms, leaving the other adjustment mechanism(s) in a static state. The controller can be subject to manual input, or alternatively, can be run by an automated program or mechanism. According to an embodiment, the adjustable parameters are adjusted one-time during manufacture and remain fixed after the one-time adjustment.

Figure 11:
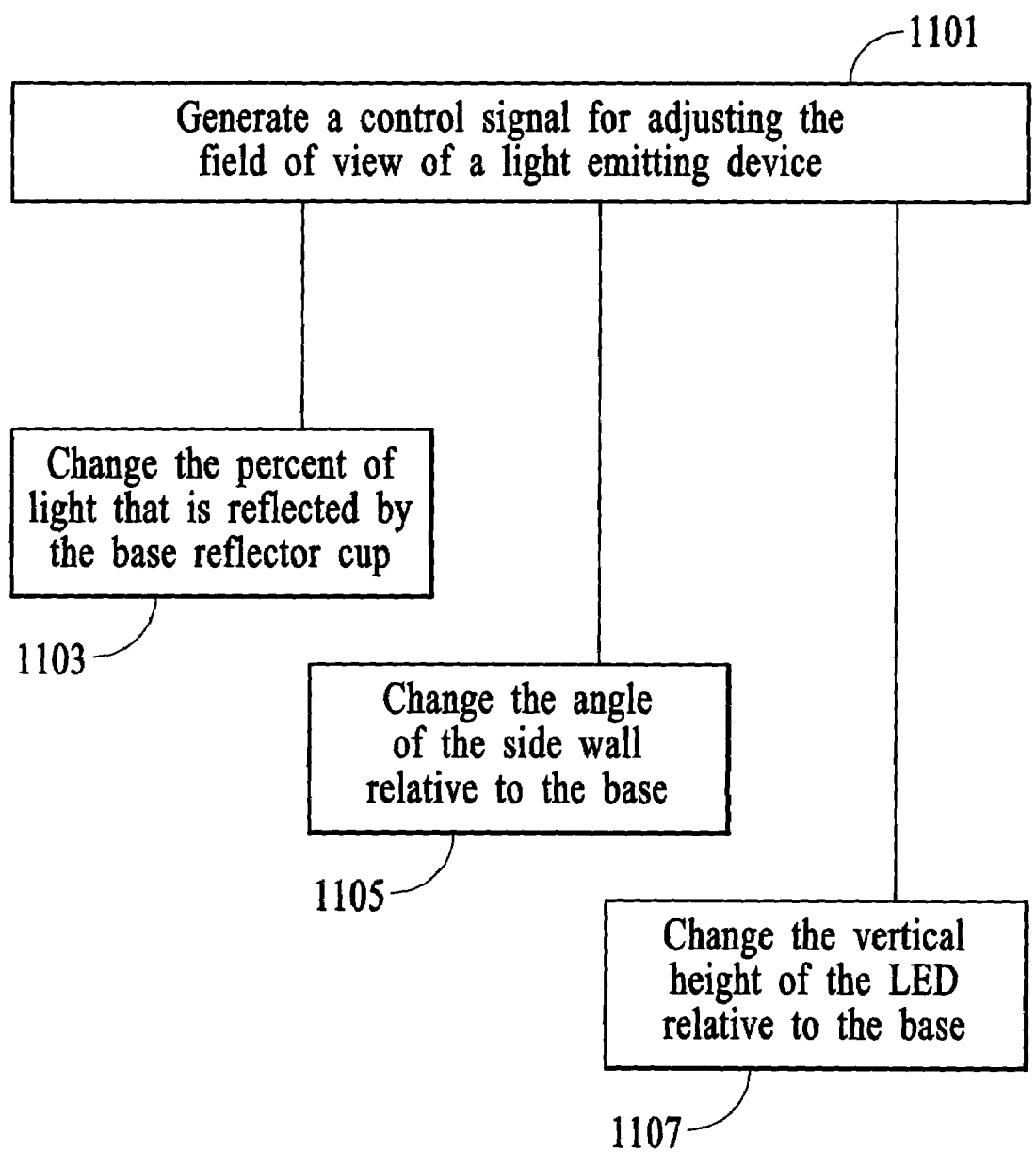
FIG. 11 is a process flow diagram of a method for adjusting the field of view in accordance with an embodiment of the invention.

FIG. 11 is a process flow diagram of a method for adjusting the field of view in accordance with an embodiment of the invention. In step 1101, a controller generates a control signal for adjusting the field of view of a light emitting device. Three parallel steps independently follow step 1101. In step 1103, a base adjustment signal changes a percent of light that is reflected by the base of the reflector cup. In step 1105, a sidewall adjustment signal changes the angle of the sidewall relative to the base. In step 1107, a vertical adjustment signal changes the vertical height of the LED relative to the base.

A light emitting device having an adjustable reflector cup as described above with reference to FIGS. 2A-11 can be used in conjunction with an adjustable optical system to provide another degree of adjustability. In one embodiment, a light emitting device having an adjustable reflector cup as described above is used in conjunction with a lens system that uses a motor attached to a lens to focus or de-focus the emitted light. In another embodiment, a light emitting device having an adjustable reflector cup as described above is used in conjunction with an optical system that utilizes a change in applied current or voltage between two liquids that do not mutually mix to change the focal point of the optical system. In still another embodiment, a light emitting device having an adjustable reflector cup as described above can be used in conjunction with both the motorized lens system and liquid-based adjustment systems to provide a light source with a high degree of adjustability. Although some examples of adjustable optical systems are described herein, it is contemplated that a light emitting device having an adjustable reflector cup can be used in conjunction with other adjustable optical systems to provide additional degrees of adjustability.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A light emitting device comprising:
   a light emitting diode (LED);
   a reflector cup, the LED being located within the reflector cup, the reflector cup comprising:
     a base; and
     a sidewall that sits at an angle relative to the base; and
   a sidewall adjustment mechanism configured to change the angle of the sidewall relative to the base.

2. The light emitting device of claim 1 further comprising a vertical adjustment mechanism configured to change the vertical position of the LED relative to the base.

3. The light emitting device of claim 1 further comprising a base adjustment mechanism configured to change the percentage of light that is reflected by the base.

4. The light emitting device of claim 3 further comprising a vertical adjustment mechanism configured to change the vertical position of the LED relative to the base.

5. The light emitting device of claim 3 wherein the base adjustment mechanism further comprises a reflective base structure and an adjustable base aperture that is configured to adjustably shield a variable surface area of the reflective base structure.

6. The light emitting device of claim 5 wherein the adjustable base aperture comprises a plurality of mechanically interconnected aperture plates.

7. The light emitting device of claim 6 wherein the base adjustment mechanism further comprises a micromotor.

8. The light emitting device of claim 1 wherein the sidewall adjustment mechanism comprises a plurality of mechanically interconnected aperture plates configured to enable the angle of the sidewall to change while maintaining continuity of the sidewall.

9. The light emitting device of claim 8 wherein the sidewall adjustment mechanism comprises a micromotor.

10. A light emitting device comprising:
    a light emitting diode (LED);
    a reflector cup, the LED being located within the reflector cup, the reflector cup comprising:
      a base; and
      a sidewall that sits at an angle relative to the base; and
    a base adjustment mechanism configured to change the percentage of light that is reflected by the base.

11. A light emitting device comprising:
a light emitting diode (LED);
a reflector cup, the LED being located within the reflector cup, the reflector cup comprising:
   a base having an area that reflects light emitted from the LED; and
   a sidewall that sits at an angle relative to the base;
wherein the area of the base which reflects light from the LED is adjustable.

12. The light emitting device of claim 11 further comprising
a base adjustment mechanism configured to change the size of the area of the base surface that reflects light emitted from the LED.

13. A method for adjusting an intensity profile of light emitted from a light emitting device having a reflector cup with a sidewall encircling a base and a light emitting diode LED within the reflector cup, the method comprising:
adjusting the field of view of the light emitting device by one of:
   changing the percent of light that is reflected by the base of the reflector cup;
   changing the angle of the sidewall relative to the base; and
   changing the vertical position of the LED relative to the base;
wherein changing the percent of light that is reflected by the base of the reflector cup comprises constricting or dilating an aperture.

14. The method according to claim 13 wherein the sidewall comprises a plurality of aperture plates, the method further comprising imparting a force on at least one aperture plate.

15. The method according to claim 14 further comprising:
generating a sidewall adjustment signal from a controller, wherein the sidewall adjustment signal affects the force imparted on the at least one aperture plate.

16. The method according to claim 13 wherein adjusting the field of view comprises adjusting a vertical position of the LED relative to the base.

17. The method according to claim 16 wherein the LED is coupled to a distil end of a shaft, the method further comprising the steps:
generating a vertical control signal form a controller; and,
imparting a vertical adjustment force to the shaft.

18. The method according to claim 17 further comprising controlling a motor with the vertical control signal.

19. A light emitting device comprising:
a light emitting diode (LED);
a reflector cup, the LED being located within the reflector cup, the reflector cup comprising:
   a base having an area that reflects light emitted from the LED; and
   a sidewall that sits at an angle relative to the base;
wherein the angle of the sidewall relative to the base is adjustable.

20. The light emitting device of claim 19 further comprising a sidewall adjustment mechanism configured to change the angle of the sidewall relative to the base.

* * * * *